United States Patent [19]
Genest

[11] Patent Number: 5,483,194
[45] Date of Patent: Jan. 9, 1996

[54] DIFFERENTIAL CURRENT MODE AMPLIFIER DEVICE

[75] Inventor: Pierre Genest, Butry Sur Oise, France

[73] Assignee: Alcatel Mobile Communication France, Paris, France

[21] Appl. No.: 331,286

[22] Filed: Oct. 28, 1994

[30] Foreign Application Priority Data

Nov. 2, 1993 [FR] France .................... 93 13000

[51] Int. Cl.⁶ ........................................ H03F 3/45
[52] U.S. Cl. .................. 330/253; 327/359; 330/257; 330/258
[58] Field of Search ........................... 330/253, 257, 330/258; 327/356, 359

[56] References Cited

U.S. PATENT DOCUMENTS

| | | |
|---|---|---|
| 3,867,685 | 2/1975 | Ahmed . |
| 4,757,273 | 7/1988 | Bray . |
| 5,021,744 | 6/1991 | Van De Plassche ................ 330/257 |
| 5,132,640 | 7/1992 | Tanaka et al. . |
| 5,198,781 | 3/1993 | Kusakabe ............................ 330/257 |

FOREIGN PATENT DOCUMENTS

| | | |
|---|---|---|
| 0534007A1 | 3/1993 | European Pat. Off. . |
| 2010038 | 6/1979 | United Kingdom . |

OTHER PUBLICATIONS

E. Seevinck, "Design and Application of Integrated Analog Interface Circuits", *1988 IEEE International Symposium on Circuits and System Proceedings*, vol. 2, Jun. 7, 1988, pp. 1923–1925.

French Search Report FR 9313000 Jul. 21, 1994.

*Primary Examiner*—James B. Mullins
*Attorney, Agent, or Firm*—Sughrue, Mion, Zinn, Macpeak & Seas

[57] ABSTRACT

A differential current mode amplifier device generates a common mode bias current. A translinear multiplier receives at two inputs this common mode bias current and a differential mode current to be amplified and delivers at two outputs an amplified differential mode current. The translinear multiplier is biased in a manner depending on the bias current received by the translinear multiplier. The device includes a circuit for compensating the common mode current at the output of the translinear multiplier.

15 Claims, 3 Drawing Sheets

DIFFERENTIAL CURRENT MODE AMPLIFIER DEVICE

BACKGROUND OF THE INVENTION

1. Field of the Invention

The field of the invention is that of analog signal processing. Analog signal processing includes amplifying a signal before analog to digital conversion, for example, and can be carried out only on a signal having sufficient energy, since the processing usually consumes a great deal of energy. A signal to be processed is usually a low-energy signal and it is therefore necessary to amplify the signal to increase its energy before it is processed.

The invention concerns an amplifier device for increasing the energy of a signal so that it can be processed.

The invention can be implemented in a differential electronic circuit, for example. In this case amplifier devices of the invention can alternate with filter stages.

More generally, the invention is applicable whenever a device has to provide a gain (often relatively low).

2. Description of the Prior Art

There are various types of prior art amplifier device.

Some prior art amplifier devices use a non-differential structure. This non-differential structure has various drawbacks, including high levels of noise and offset.

Other prior art amplifier devices use a differential structure. This differential structure does not give rise to any significant noise or offset, but nevertheless has drawbacks.

In a voltage mode differential structure the value of the gain is difficult to control, the energy consumption can only be low, to the detriment of speed, and achieving a high bandwidth necessitates high current consumption.

A current mode differential structure palliates the drawbacks associated with a non-differential structure but there is unwanted common mode gain.

Finally, amplifier devices based on this differential structure, whether they are voltage mode or current mode devices, are usually operational amplifiers, i.e. devices intended always to be used with feedback.

Operational amplifiers are used with feedback, even if a low gain is required. For example, it is routine practice to use an operational amplifier having a high gain (equal to 1,000, for example) in open loop mode to obtain a low gain (equal to 10, for example) in closed loop mode. This obviously entails excess current consumption.

SUMMARY OF THE INVENTION

A particular objective of the invention is to palliate these various drawbacks of the prior art.

To be more precise, an object of the invention is to provide an amplifier device having low consumption combined with high bandwidth.

Another object of the invention is to provide an amplifier device of this kind which can be used in open loop mode.

A further object of the invention is to provide an amplifier device of this kind offering low noise, low current offset, accurately defined gain and good common mode rejection.

A still further object of the invention is to provide an amplifier device of this kind which can be implemented with bipolar transistors or MOS transistors.

These objects, and others that emerge below, are achieved in accordance with the invention by means of a differential current mode amplifier device comprising:

means for generating a common mode bias current;

a translinear multiplier receiving at two inputs said common mode bias current and a differential mode current to be amplified and delivering at two outputs an amplified differential mode current;

means for biasing said translinear multiplier in a manner dependent on said bias current received by said translinear multiplier; and means for compensating the common mode current at said outputs of said translinear multiplier.

The amplifier device of the invention thus has a current mode differential structure. It can be used in open loop mode.

In this case the amplifier device of the invention is used without feedback and its open loop gain can be low (equal to 10, for example) since its actual gain is used. This reduces current consumption.

The amplifier device of the invention has the advantages associated with a differential structure, namely low noise and low offset, combined with those associated with current mode, namely a high bandwidth and accurately defined gain.

Amplification is achieved in a novel way using a translinear multiplier. It should be noted that translinear multipliers are usually employed to reproduce complex mathematical functions (square roots, absolute values, etc) or to implement mixers.

Finally, the bias means of the translinear multiplier and the common mode current compensator means at the output of the translinear multiplier enable effective use of the amplifier device of the invention in open loop mode.

Only the differential mode current represents a wanted signal and is to be amplified. The translinear multiplier may receive at its inputs a further common mode component, separate from that providing the biasing.

In this case, the ratio of the current present at one output to the current present at the corresponding input is no longer equal to the predetermined gain. This phenomenon is referred to as poor gain accuracy.

Also, this further common mode component appears at the outputs of the translinear multiplier. This phenomenon is referred to as poor common mode rejection.

The function of the bias means of the translinear multiplier is to achieve good gain accuracy and the function of the common mode current compensator means is to achieve very good common mode rejection.

Advantageously, said translinear multiplier includes a pair of input transistors and at least one differential pair of output transistors, said output transistors of said differential pair having a common first terminal constituting a point of addition of amplified currents through said output transistors of said translinear multiplier, said bias means include at least one current mirror having a first branch conveying an original current and at least one second branch conveying a copy current, said first current mirror branch including a first branch transistor connected by a first terminal to said input transistors of said translinear multiplier, said second current mirror branch including a second branch transistor connected by a first terminal to said current addition point of said translinear multiplier and by a second terminal to a second terminal of said first branch transistor, and said common mode current compensator means comprise:

means for copying the common mode current conveyed by said second current mirror branch transistor, and means for injecting a common mode current copied by said current copier means into a second terminal of each of said output transistors of said translinear multiplier, said second terminals of said output transistors constituting said outputs of said translinear multiplier.

The translinear multiplier is automatically biased because of the current mirrors.

The bias means ensure that the common mode current through an output transistor of the translinear multiplier is equal to the product of the gain and the common mode current through the corresponding input transistor. Accordingly, the radiating element has good gain accuracy.

Finally, the common mode current compensator means ensure that the common mode current injected into an output transistor of the translinear multiplier is identical to the common mode current through it. Accordingly, the radiating element offers very good common mode rejection.

Advantageously, said common mode current copier means include an additional second current mirror branch including a second branch transistor connected by a first terminal to said injector means and by a second terminal to said second terminal of said first branch transistor of said bias means.

Preferably, said common mode current copier means include means for maintaining a constant voltage in order to obtain at said first terminal of said transistor of said additional second current mirror branch a voltage equal to that at said first terminal of said first branch transistor of said bias means.

This eliminates any voltage fluctuations due to the differential current and ensures that the additional second current mirror branch produces a correct copy of the current.

Preferably, said means for maintaining a constant voltage include:

a first voltage maintaining transistor connected by a first terminal to said copied current injector means, by a second terminal to one of said inputs of said translinear multiplier and by a third terminal to said first terminal of said additional second current mirror branch transistor, and a second voltage maintaining transistor connected by a first terminal to said copied current injector means, by a second terminal to the other of said inputs of said translinear multiplier and by a third terminal to said first terminal of said additional second current mirror branch transistor.

Advantageously, said copied current injector means include at least two first current mirrors each having a first branch connected to said common mode current copier means and a second branch connected to one of said outputs of said translinear multiplier, said first branches of said two first current mirrors being common.

Preferably, said copied current injector means include two second current mirrors in cascade with said first current mirrors.

These second current mirrors improve the output resistance of the transistors of the first current mirrors.

Advantageously, said common mode bias current generator means are selected from the group comprising current sources and resistors.

In a preferred embodiment of the invention, an input cell on the input side of said translinear multiplier has a very low input impedance.

Said input cell advantageously includes a double current conveyor.

The amplifier device advantageously includes transistors selected from the group comprising bipolar transistors and MOS transistors.

In a first advantageous embodiment of the invention the transistors in said translinear multiplier, said bias means and said common mode current copier means are NPN resistors and the transistors in said copied current injector means are PNP transistors.

In a second advantageous embodiment of the invention the transistors in said translinear multiplier, said bias means and said common mode current copier means are PNP transistors and the transistors in said copied current injector means are NPN transistors.

In a third advantageous embodiment of the invention the transistors in said translinear multiplier, said bias means and said common mode current copier means are PMOS transistors and the transistors in said copied current injector means are NMOS transistors.

In a fourth advantageous embodiment of the invention the transistors in said translinear multiplier, said bias means and said common mode current copier means are NMOS transistors and the transistors in said copied current injector means are PMOS transistors.

In other words, in these various embodiments of the invention the amplifier device comprises two sets of means (namely a first set of means comprising the translinear multiplier, the bias means and the current copier means and a second set of means comprising the current injector means), each set of means using transistors having a distinct structure symmetrical to that of the transistors of the other set of means.

Accordingly, when one set of means comprises NMOS (respectively PNP) transistors, the other set of means comprises PMOS (respectively NPN) transistors.

Other features and advantages of the invention will emerge from a reading of the following description of two preferred embodiments of the invention given by way of non-limiting illustrative example and from the appended drawings.

DETAILED DESCRIPTION OF THE PREFERRED EMBODIMENTS

The invention concerns a current mode amplifier device having a differential structure. The amplifier device can be used in open loop mode (for example) and this is the case in the remainder of the description. However, it is clear that the invention is not limited to this mode of use and can in some cases be used with feedback (direct or indirect).

Figure 1:
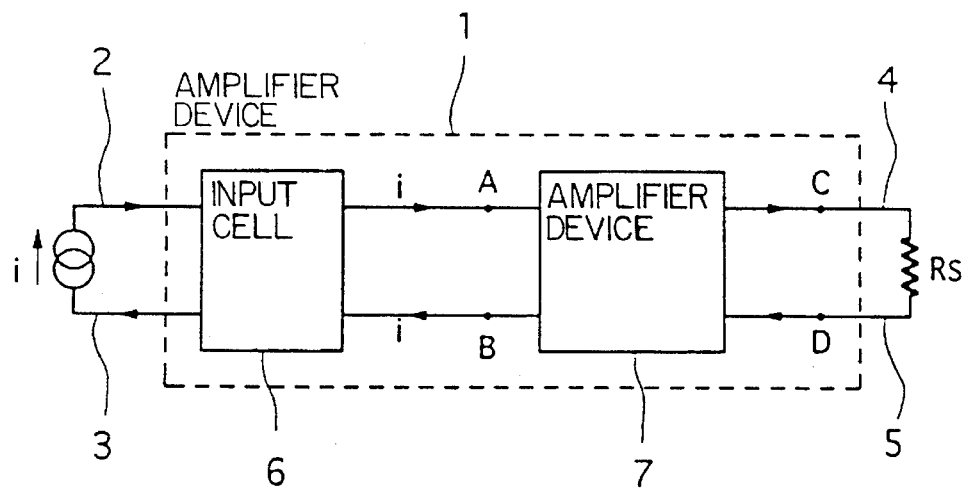
FIG. 1 is a block diagram of one embodiment of an amplifier device of the invention.

As shown in the FIG. 1 block diagram, an amplifier device 1 of this kind has two differential inputs 2, 3 for current to be amplified and two differential outputs 4, 5 for amplified current. The two differential outputs 4, 5 are connected to a load or to another device (a filter device or a further amplifier device, for example). These various possibilities are symbolically represented by the output resistor RS.

In the example shown in FIG. 1 the amplifier device 1 includes an input cell 6 providing a low input impedance. The input cell 6 includes a double current conveyor, for example.

The use of an input cell 6 is optional and to simplify the remainder of the description the term "amplifier device" will also be used to refer to the set 7 of means on the output side of the input cell 6.

Figure 2:
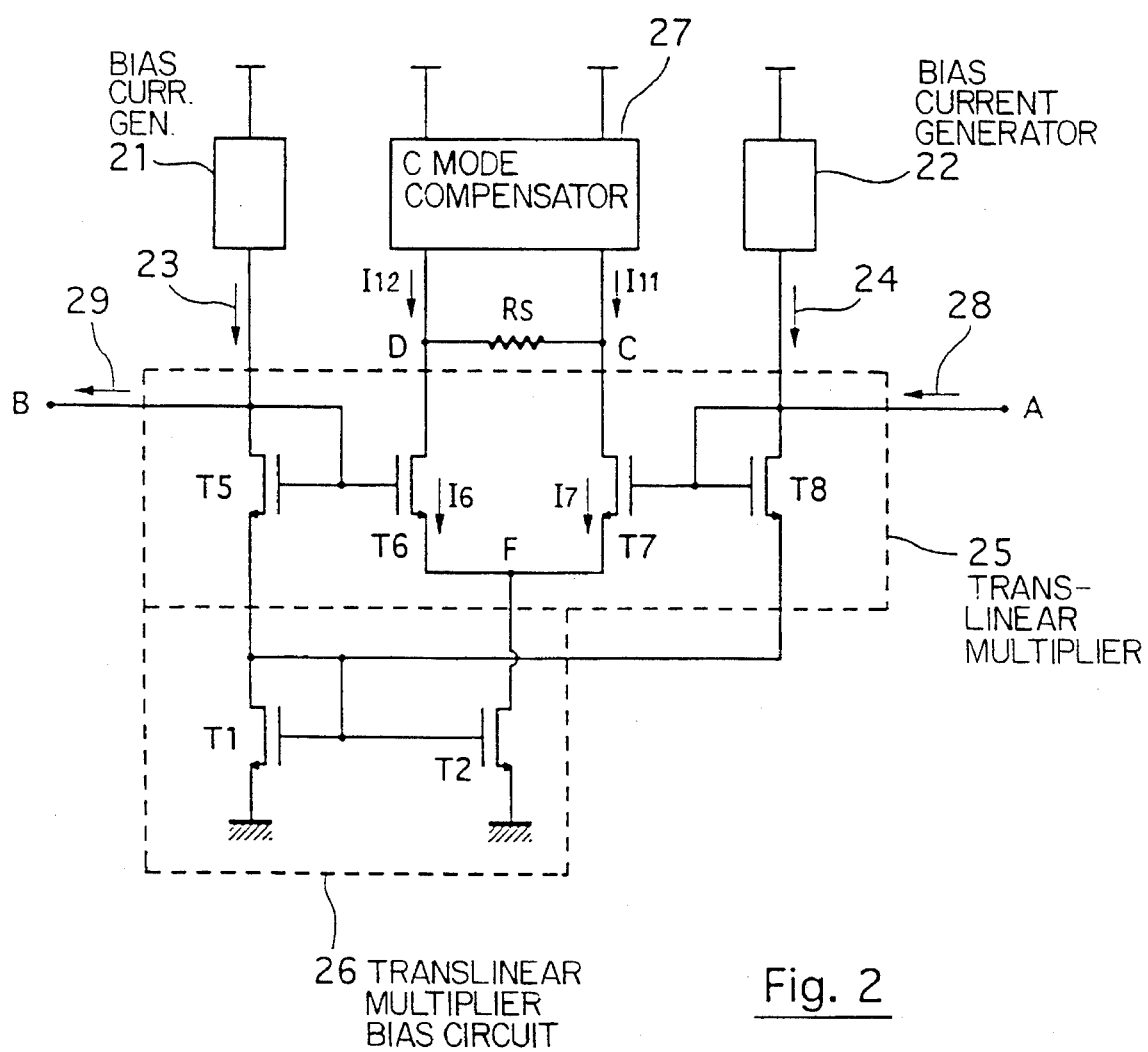
FIG. 2 is a simplified logic diagram of an amplifier device of the invention.

FIG. 2 is a simplified logic diagram of the amplifier device 7 which includes:

means 21, 22 for generating a common mode bias current 23, 24;

a translinear multiplier 25;

means 26 for biasing the translinear multiplier 25; and means 27 for compensating the common mode current at the output of the multiplier 25.

The means 21, 22 for generating a common mode bias current are current sources or resistors, for example.

The translinear multiplier 25 has two differential inputs A, B and two differential outputs C, D. At the two inputs A, B it receives the common mode bias current 23, 24 and the differential mode current to be amplified 28, 29. At its two differential outputs C, D it delivers an amplified differential mode current.

In the remainder of the description the transistors used in the amplifier device of the invention are MOS transistors. However, it is clear that the invention can be implemented using bipolar transistors, and the person skilled in the art will find no major difficulty in changing from MOS transistors to bipolar transistors.

As shown in FIG. 2, the translinear multiplier 25 includes an input transistor pair T5, T8 and a differential output transistor pair T6, T7.

In this example the transistors used in the translinear multiplier 25 are NMOS transistors and the sources of the output transistors of the differential pair T6, T7 are connected together and constitute a point F of addition of the amplified currents I6, I7 through the output transistors T6, T7.

The bias means 26 include a current mirror (T1, T2) for biasing the translinear multiplier automatically.

In the example shown in FIG. 2 the current mirror (T1, T2) comprises:

a first branch comprising a transistor T1 whose drain is connected to the sources of the input transistors T5, T8 of the multiplier, and a second branch comprising a transistor T2 whose drain is connected to the addition point F and whose gate is connected to the gate of the transistor T1 of the first branch.

The transistors used in the bias means 26 are NMOS transistors.

To summarize, the bias means 26 receive, in the first branch, a common mode current (made up of the bias current 23, 24 and possibly an additional (error) component) via the input transistors T5, T8 of the translinear multiplier 25 and copy (and multiply) it into the second branch, to bias the output transistors T6, T7 of the differential pair of the translinear multiplier 25. Accordingly, if there is any additional (error) common mode current component it cannot degrade the value of the gain since it is also multiplied by the transistors of the differential pair of the multiplier.

The common mode current compensator means 27 have no influence on the differential gain of the translinear multiplier 25 but ensure that the common mode currents (comprising the bias current and any additional current) I11, I12 that they deliver to the output transistors of the translinear multiplier are identical to the bias currents I6, I7 through the output transistors. In other words, using the reference symbols adopted, the compensator means 27 ensure that I11=I7 and I12=I6.

Accordingly, any common mode component (which may be present because the bias means 26 copy into the output transistors all of the common mode current through the input transistors of the translinear multiplier) is not seen the outputs C, D of the amplifier device. The amplifier device therefore offers very good common mode rejection.

To avoid common mode amplification, instead of using the current sources associated with the output transistors T6, T7 of the translinear multiplier 25, the invention uses the bias current from the current sources associated with the input transistors T5, T8 of the translinear multiplier 25.

Figure 3:
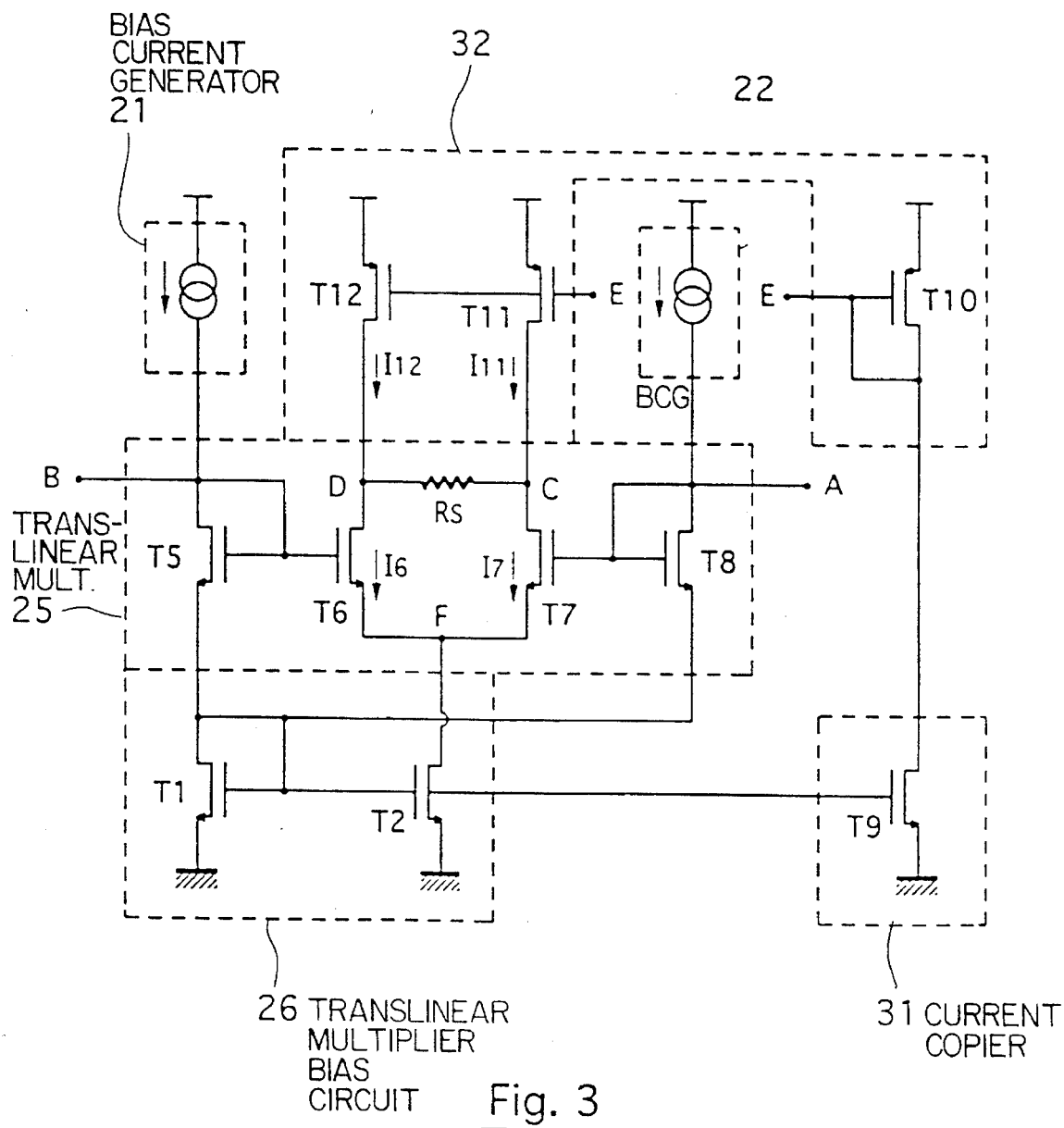
FIG. 3 is a simplified block diagram of a first embodiment of an amplifier device of the invention.
Figure 4:
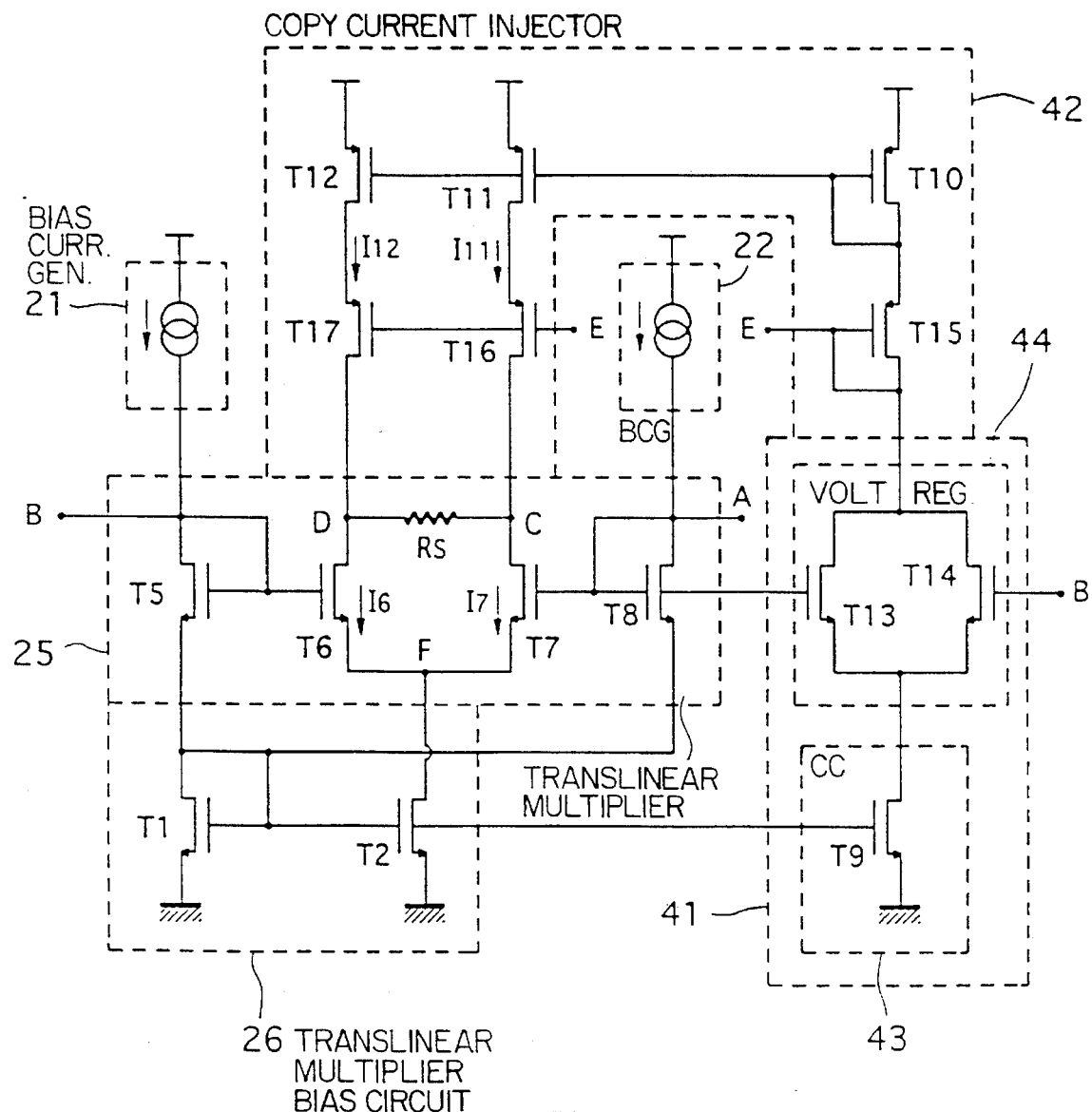
FIG. 4 is a simplified block diagram of a second embodiment of an amplifier device of the invention.

FIGS. 3 and 4 each show a simplified block diagram of a respective embodiment of an amplifier device of the invention.

These two figures show some modules previously mentioned in connection with FIG. 2, namely the translinear multiplier 25, the translinear multiplier bias means 26 and the means 21, 22 for generating a common mode bias current (which are current sources in this instance).

In both these embodiments of the invention the common mode current compensator means comprise:

means 31, 41 for copying the common mode bias current through the transistor T2 of the second branch of the current mirror of the bias means 26, and means 32, 42 for injecting a current copied by the current copier means 31, 41 into the output terminals of the output transistors T6, T7 of the translinear multiplier 25 which constitute the differential outputs C, D of the amplifier device.

In the first embodiment of the invention shown in FIG. 3 the common mode current copier means 31 comprise an additional second current mirror branch which cooperates with the first branch of the current mirror (T1, T2) of the bias means 26 to constitute a new current mirror.

This additional second current mirror branch comprises, in this example, an NMOS transistor T9 whose gate is connected to the gates of the transistors T1, T2 of the current mirror of the bias means 26 and whose drain is connected to the current injector means 32.

Accordingly, the function of the additional second branch transistor T9 is to reproduce the common mode bias current through the transistors T1 and T2.

The copied current injector means 32 comprise two current mirrors (T10, T11), (T10, T12) having a common first branch, for example.

In this case, as shown in FIG. 3, the first common branch includes a transistor T10 whose drain is connected to the drain of the additional second branch transistor T9 of the current copier means 31. The second branch of each of the two current mirrors of the copied current injector means 32 includes a transistor T11, T12 whose gate is connected to the gate of the first branch transistor T10 and whose drain is connected to one of the two outputs C, D of the amplifier device (i.e. to the drain of one of the two output transistors T6, T7 of the translinear multiplier 25).

Accordingly, the same common mode bias current I11, I12 flows through the two transistors T11, T12 to the two differential outputs C, D of the amplifier device. The currents I11, I12 are equal to the bias currents I6, I7 through the output transistors T6, T7 of the translinear multiplier 25. This guarantees very good common mode rejection.

In this embodiment the transistors of the translinear multiplier 25, the bias means 26 and the current copier means 31 are NMOS transistors and the transistors of the copied current injector means 32 are PMOS transistors.

It is clear that in a different embodiment "symmetrical" to the present embodiment the NMOS transistors can be replaced with PMOS transistors and vice versa.

In the embodiment of the invention using bipolar transistors, the transistors of the translinear multiplier 25, the bias means 26 and the current copier means 31 are NPN (respectively PNP) transistors and the transistors of the copied current injector means 32 are PNP (respectively NPN) transistors.

The second embodiment of the invention shown in FIG. 4 differs from the first embodiment of the invention only in that further means are added to the current copier means 41 and the current injector means 42.

To be more precise, in addition to the additional second current mirror branch 43 (which has the reference number 31 in FIG. 3), the current copier means 41 include means 44 for maintaining a constant voltage at the drain of the transistor T9 of the additional second branch. This eliminates voltage fluctuations due to the differential current and enhances the copy current.

The constant voltage maintained at the drain of the transistor T9 is substantially equal to the voltage at the drains of the input transistors T5, T8 of the translinear multiplier 25.

The means 44 for maintaining a constant voltage include, for example and as shown in FIG. 4, two transistors T13, T14 whose drains are connected (together) to the drain of the first branch transistor T10 of the current mirrors of the current injector means 42, the sources of which are connected (together) to the drain of the additional second branch transistor T9 and whose gates are connected to a respective input A, B of the translinear multiplier 25.

Accordingly, any differential current at the inputs A, B is cancelled and the current mirror whose transistor T9 constitutes the second branch operates perfectly.

With reference to the copied current injector means 42, two second current mirrors (T15, T16), (T15, T17) are in cascade with the two first current mirrors (T10, T11), (T10, T12) and improve the output resistance of the transistors T10, T11, T12 of the first current mirrors.

There is claimed:

1. Differential current mode amplifier device comprising:
   means for generating a common mode bias current;
   a translinear multiplier receiving at two inputs said common mode bias current and a differential mode current to be amplified and delivering at two outputs an amplified differential mode current;
   means for biasing said translinear multiplier in a manner dependent on said bias current received by said translinear multiplier; and
   means for compensating the common mode current at said outputs of said translinear multiplier.

2. Amplifier device according to claim 1 wherein said translinear multiplier includes a pair of input transistors and at least one differential pair of output transistors, said output transistors of said differential pair having a common first terminal constituting a point of addition of amplified currents through said output transistors of said translinear multiplier,
   said bias means include at least one current mirror having a first branch conveying an original current and at least one second branch conveying a copy current, said first current mirror branch including a first branch transistor connected by a first terminal to said input transistors of said translinear multiplier, said second current mirror branch including a second branch transistor connected by a first terminal to said current addition point of said translinear multiplier and by a second terminal to a second terminal of said first branch transistor, and
   said common mode current compensator means comprise:
   means for copying the common mode current conveyed by said second current mirror branch transistor, and
   means for injecting a common mode current copied by said current copier means into a second terminal of each of said output transistors of said translinear multiplier, said second terminals of said output transistors constituting said outputs of said translinear multiplier.

3. Amplifier device according to claim 2 wherein said common mode current copier means include an additional second current mirror branch including a second branch transistor connected by a first terminal to said injector means and by a second terminal to said second terminal of said first branch transistor of said bias means.

4. Amplifier device according to claim 3 wherein said common mode current copier means include means for maintaining a constant voltage in order to obtain at said first terminal of said transistor of said additional second current mirror branch a voltage equal to that at said first terminal of said first branch transistor of said bias means.

5. Amplifier device according to claim 4 wherein said means for maintaining a constant voltage include:
   a first voltage maintaining transistor connected by a first terminal to said copied current injector means, by a second terminal to one of said inputs of said translinear multiplier and by a third terminal to said first terminal of said additional second current mirror branch transistor, and
   a second voltage maintaining transistor connected by a first terminal to said copied current injector means, by a second terminal to the other of said inputs of said translinear multiplier and by a third terminal to said first terminal of said additional second current mirror branch transistor.

6. Amplifier device according to claim 2 wherein said copied current injector means include at least two first current mirrors each having a first branch connected to said common mode current copier means and a second branch connected to one of said outputs of said translinear multiplier, said first branches of said two first current mirrors being common.

7. Amplifier device according to claim 6 wherein said copied current injector means include two second current mirrors in cascade with said first current mirrors.

8. Amplifier device according to claim 1, wherein said common mode bias current generator means are current sources or resistors.

9. Amplifier device according to claim 1 including an input cell on the input side of said translinear multiplier and having a very low input impedance.

10. Amplifier device according to claim 9 wherein said input cell includes a double current conveyor.

11. Amplifier device according to claim 1, comprising transistors that are bipolar transistors or MOS transistors.

12. Amplifier device according to claim 11 wherein the transistors in said translinear multiplier, said bias means and said common mode current copier means are NPN transistors and the transistors in said copied current injector means are PNP transistors.

13. Amplifier device according to claim 11 wherein the transistors in said translinear multiplier, said bias means and said common mode current copier means are PNP transistors and the transistors in said copied current injector means are NPN transistors.

14. Amplifier device according to claim 11 wherein the transistors in said translinear multiplier, said bias means and said common mode current copier means are NMOS transistors and the transistors in said copied current injector means are PMOS transistors.

15. Amplifier device according to claim 11 wherein the transistors in said translinear multiplier, said bias means and said common mode current copier means are PMOS transistors and the transistors in said copied current injector means are NMOS transistors.

* * * * *